(12) United States Patent
Takahashi et al.

(10) Patent No.: US 11,166,397 B2
(45) Date of Patent: Nov. 2, 2021

(54) POWER CONVERSION DEVICE

(71) Applicant: TOSHIBA MITSUBISHI-ELECTRIC INDUSTRIAL SYSTEMS CORPORATION, Chuo-ku (JP)

(72) Inventors: Nobuhiro Takahashi, Tokyo (JP); Tatsuji Katayama, Tokyo (JP)

(73) Assignee: TOSHIBA MITSUBISHI—ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/966,594

(22) PCT Filed: Feb. 2, 2018

(86) PCT No.: PCT/JP2018/003679
§ 371 (c)(1),
(2) Date: Jul. 31, 2020

(87) PCT Pub. No.: WO2019/150560
PCT Pub. Date: Aug. 8, 2019

(65) Prior Publication Data
US 2020/0367390 A1 Nov. 19, 2020

(51) Int. Cl.
*H05K 7/20* (2006.01)
*H02M 7/00* (2006.01)
*H05K 7/14* (2006.01)

(52) U.S. Cl.
CPC ........ *H05K 7/20945* (2013.01); *H02M 7/003* (2013.01); *H05K 7/1427* (2013.01); *H05K 7/20909* (2013.01); *H05K 7/20927* (2013.01)

(58) Field of Classification Search
CPC ................................................ H05K 7/20945
See application file for complete search history.

(56) References Cited

U.S. PATENT DOCUMENTS 5,823,248 A * 10/1998 Kadota ............... F28D 15/0233
165/104.33
6,278,080 B1    8/2001 Moriguchi et al.
(Continued)

FOREIGN PATENT DOCUMENTS

JP    2000-166217 A    6/2000
JP    2011-188593 A    9/2011
(Continued)

OTHER PUBLICATIONS

International Preliminary Report on Patentability dated Aug. 6, 2020 in PCT/JP2018/003679 (English Translation only), 6 pages.
(Continued)

*Primary Examiner* — Mukundbhai G Patel
(74) *Attorney, Agent, or Firm* — Oblon, McClelland, Maier & Neustadt, L.L.P.

(57) ABSTRACT

A power conversion device includes: a casing including a housing portion; a circuit board housed in the housing portion, the circuit board including an inverter circuit or an inverter control circuit configured to control the inverter circuit; a cooling fan configured to generate air flowing through the housing portion to cool the circuit board; a temperature sensor configured to sense a temperature inside or outside the casing; and a cooling fan control circuit configured to drive the cooling fan. The cooling fan control circuit is configured to, if the temperature sensed by the temperature sensor is higher than a predetermined temperature, turn on the cooling fan, and if the sensed temperature is equal to or below the predetermined temperature, control the cooling fan to turn off the cooling fan or make a speed of the flowing air lower than a speed when the cooling fan is in the on state.

8 Claims, 10 Drawing Sheets

A-A SECTION

(56) References Cited

U.S. PATENT DOCUMENTS

| | | | | |
|---|---|---|---|---|
| 2010/0118488 A1* | 5/2010 | Hoffman | ............ | H05K 7/20909 |
| | | | | 361/691 |
| 2016/0360643 A1* | 12/2016 | Pal | ..................... | H05K 7/20936 |
| 2017/0086336 A1 | 3/2017 | Matsuoka et al. | | |

FOREIGN PATENT DOCUMENTS

| | | | |
|---|---|---|---|
| JP | 2012-228062 A | 11/2012 |
| JP | 2013-78216 A | 4/2013 |
| JP | 2014-147251 A | 8/2014 |
| JP | 2017-99202 A | 6/2017 |
| JP | 2017-204901 A | 11/2017 |
| WO | WO 2015/186208 A1 | 12/2015 |

OTHER PUBLICATIONS

International Search Report dated Apr. 17, 2018 in PCT/JP2018/003679 filed Feb. 2, 2018, 4 pages.

* cited by examiner

A-A SECTION

POWER CONVERSION DEVICE

FIELD

This application relates to a power conversion device.

BACKGROUND

Conventionally, as disclosed in, for example, JP 2012-228062 A, power conditioners each including a ventilation fan for ventilation have been known. In the technique according to this publication, a ventilation filter is embedded in a side surface of a casing of the power conditioner. A ventilation fan is disposed inside the casing so as to overlap the ventilation filter. The ventilation fan is switchable between normal rotation and reverse rotation in order to enable removal of dust adhering to the ventilation filter. However, in the aforementioned literature, regarding a position to which the ventilation fan is attached, the perspective diagram of FIG. 1 just illustrates that the ventilation fan is disposed in the side surface of the casing and accompanying description is merely provided in paragraph 0017.

CITATION LIST

Patent Literature

[PTL 1] JP 2012-228062 A

SUMMARY

Technical Problem

A power conditioner is a power conversion device that converts direct-current power into alternating-current power. This type of power conversion device includes a casing, a circuit board incorporated in the casing, a heat dissipation member that receives heat from the circuit board and a cooling fan that cools the heat dissipation member. In the aforementioned conventional technique, dust entering the casing is reduced by use of the ventilation filter. However, there is a problem of there being a limit to reduction of dust by means of removal using a ventilation filter. Therefore, the inventors of the present application have found a technique that enables dust reduction with an approach that is different from the aforementioned conventional technique, by considering cooling fan control or a cooling fan attachment position for dust reduction. Regarding these points, the aforementioned conventional technique still has room for improvement.

This application has been filed in order to solve the aforementioned problem. An object of this application is to provide a power conversion device improved so as to enable reduction of dust entering a casing.

Solution to Problem

A first power conversion device disclosed in the present application includes:
a casing including a housing portion;
a circuit board housed in the housing portion, the circuit board including an inverter circuit or an inverter control circuit configured to control the inverter circuit;
a cooling fan configured to generate flowing air flowing through the housing portion so as to cool the circuit board;
a temperature sensor configured to sense a temperature inside the casing or outside the casing; and
a cooling fan control circuit configured to drive the cooling fan,
wherein the cooling fan control circuit is configured to, if the temperature sensed by the temperature sensor is higher than a predetermined temperature set in advance, turn on the cooling fan.

A second power conversion device disclosed in the present application includes:
a casing including a ceiling portion including a ceiling-side vent hole, a floor portion including a floor-side vent hole, and a housing portion provided between the ceiling portion and the floor portion, the housing portion communicating with the ceiling portion and the floor portion;
a circuit board housed in the housing portion, the circuit board including an inverter circuit or an inverter control circuit configured to control the inverter circuit;
a cooling fan configured to, upon being driven, generate flowing air flowing in the housing portion; and
a cooling fan control circuit configured to drive the cooling fan so that the flowing air flows from the ceiling-side vent hole toward the floor-side vent hole.

Advantageous Effects of Invention

The first power conversion device enables determining a necessary cooling amount according to a sensed temperature and switching the operation of the cooling fan so as to increase/decrease a speed of flowing air as necessary. When the necessity for cooling is high, the circuit board can be cooled by flowing air by turning on the cooling fan. When the necessity for cooling is low, an amount of entry of external air containing dust can be reduced by turning off the cooling fan or driving the cooling fan at a low speed.

The second power conversion device provides the following effect. Dust falls in a vertical direction because of gravity and accumulates on the lower side. Dust easily accumulates on the floor portion side. Entry of dust from the floor portion side can be suppressed by taking in air from the ceiling portion and making the air flow to the floor portion.

DESCRIPTION OF EMBODIMENTS

Embodiment 1

Figure 1:
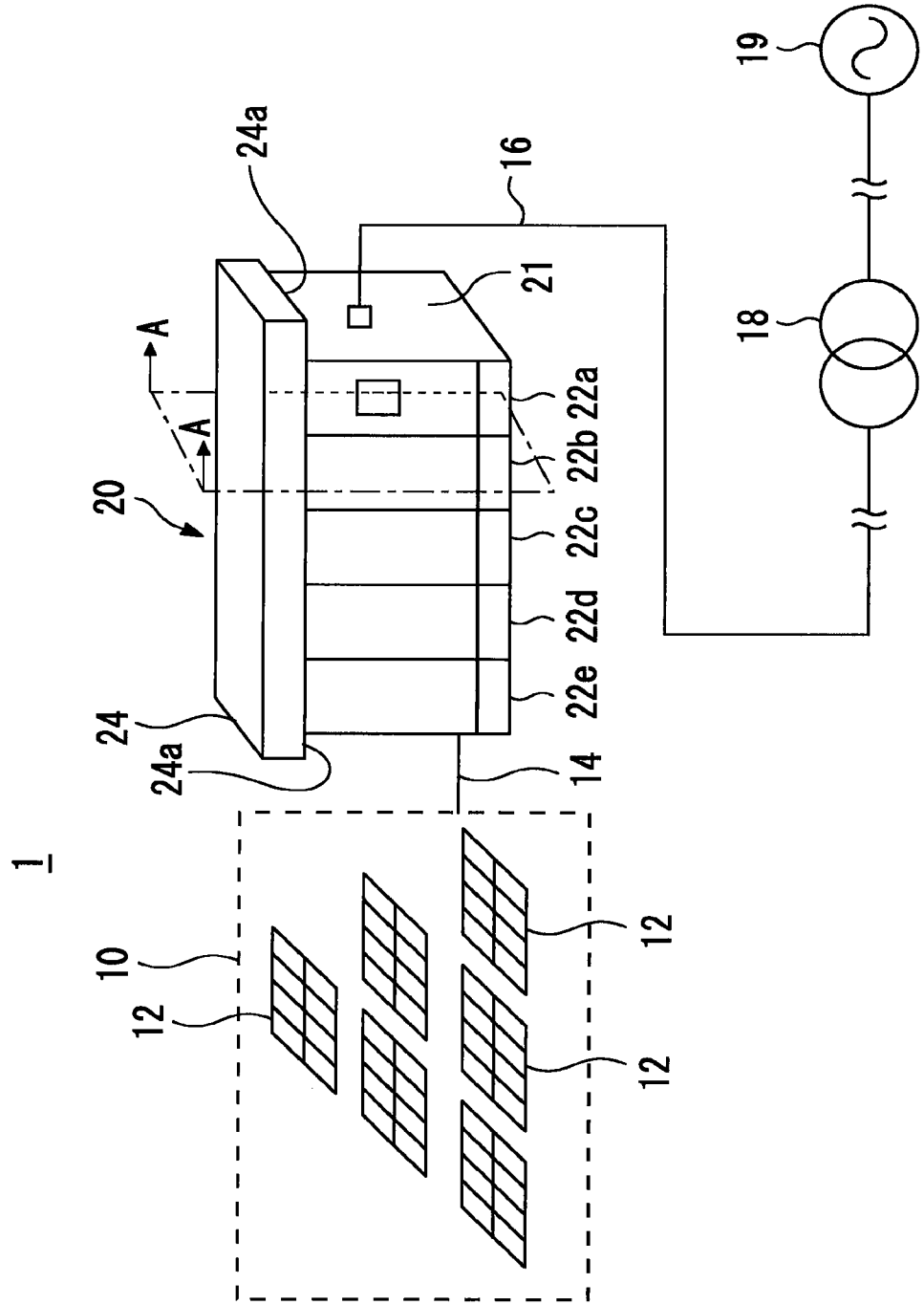
FIG. 1 is a diagram illustrating a power conversion device according to Embodiment 1 and a power system using the same.

FIG. 1 is a diagram illustrating a power conversion device 20 according to Embodiment 1 and a power system 1 using the same. The power system 1 includes a photovoltaic array 10 formed of a plurality of photovoltaic modules 12, the power conversion device 20, and a transformer 18 that receives alternating-current power from the power conversion device 20 via an output wiring 16. The power conversion device 20 converts direct-current power received from the photovoltaic array 10 via an input wiring 14 into alternating-current power. The power system 1 is what is called a distributed power source. Instead of the photovoltaic array 10, another direct-current power source may be provided. The other direct-current power source includes a storage battery, a fuel battery, or a wind power generation device that outputs direct-current power.

The power conversion device 20 included in the power system 1 is connected to a power grid 19 via the transformer 18. The power system 1 operates in coordination with the power grid 19. The power conversion device 20 includes one control unit 22a and four inverter units 22b, 22c, 22d, 22e.

Figure 2:
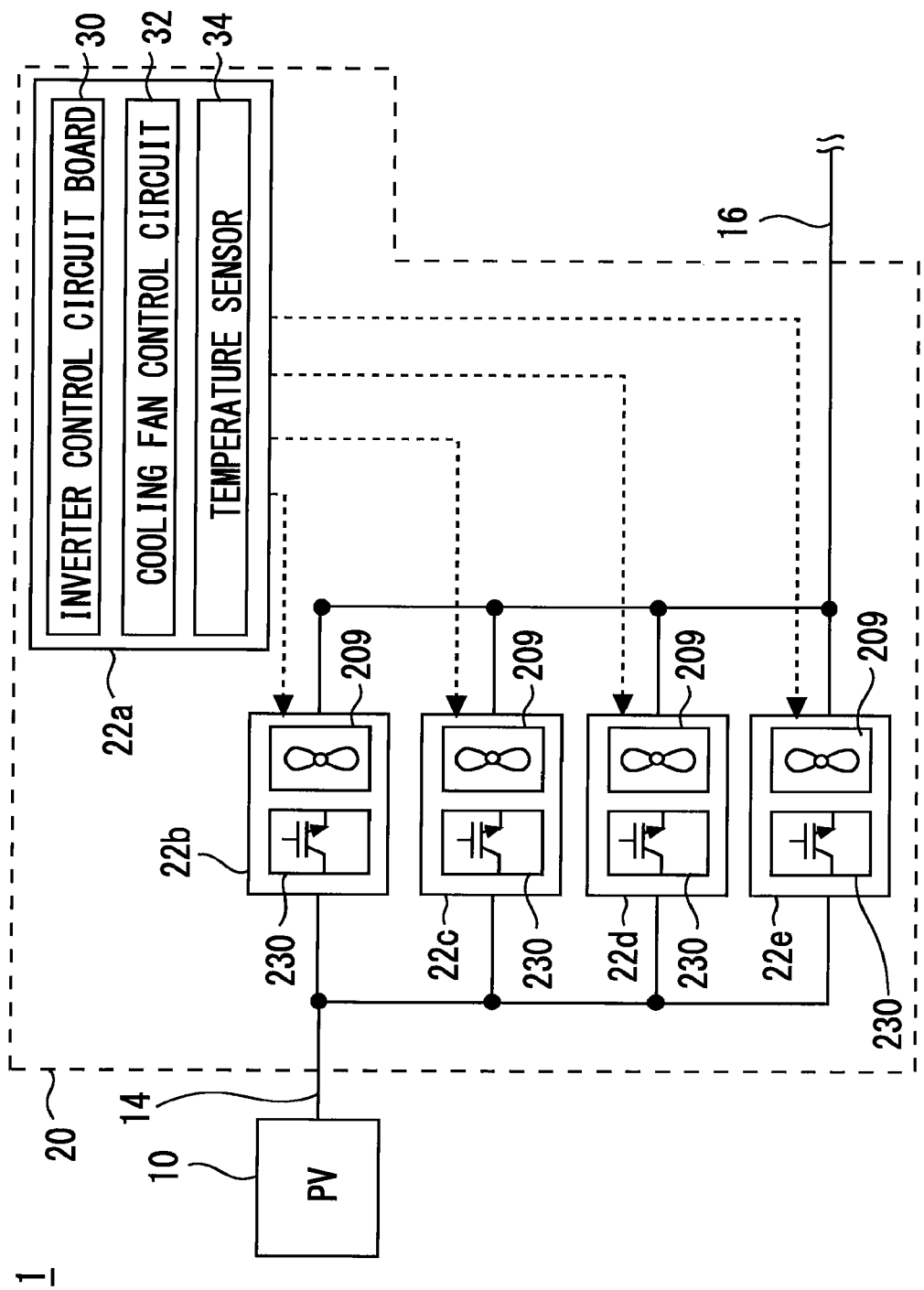
FIG. 2 is a circuit diagram of the power conversion device according to Embodiment 1.

FIG. 2 is a circuit diagram of the power conversion device 20 according to Embodiment 1. A part of the system configuration illustrated in FIG. 1 is represented by the circuit diagram. The control unit 22a and the inverter units 22b, 22c, 22d, 22e each include a casing 21. Each of the inverter units 22b to 22e includes an inverter circuit board 230 and a cooling fan 209 inside the casing 21. The inverter circuit board 230 includes a semiconductor switching device such as an IGBT or a MOSFET, and a freewheeling diode.

The control unit 22a includes an inverter control circuit board 30 inside the casing 21. The inverter control circuit board 30 includes a cooling fan control circuit 32 and a temperature sensor 34. The inverter control circuit board 30 generates PWM signals for turning on/off the semiconductor switching devices included in the inverter circuit boards 230. The temperature sensor 34 detects a temperature inside of the casing 21 or outside the casing 21. The cooling fan control circuit 32 drives the cooling fan 209 during operation of the power conversion device 20.

Figure 3:
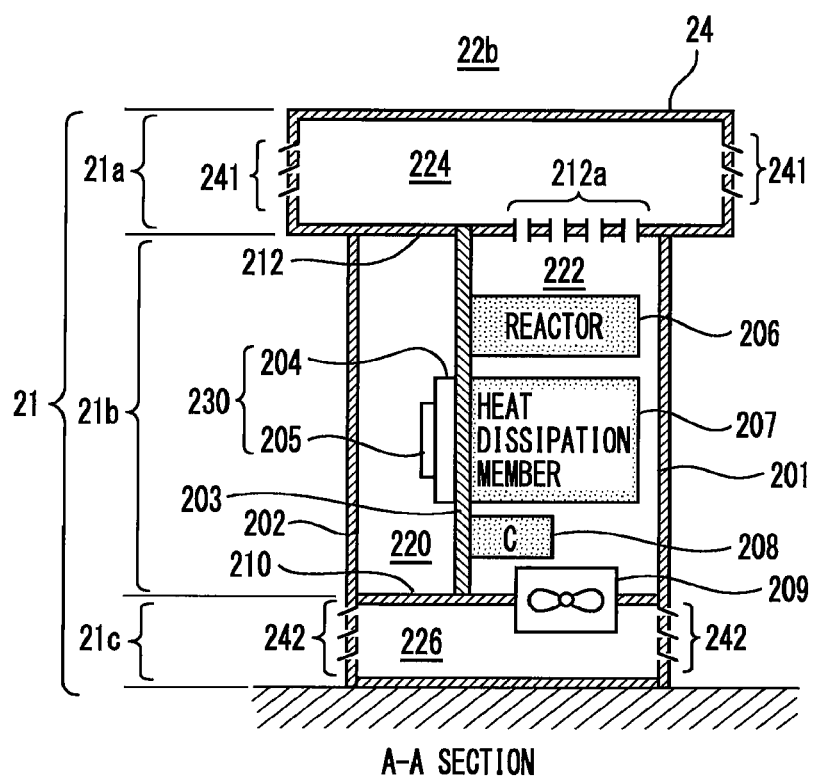
FIG. 3 is a sectional view illustrating an inner structure of the power conversion device according to Embodiment 1 and is a sectional view along an A-A imaginary plane in FIG. 1.

FIG. 3 is a sectional view illustrating an inner structure of the power conversion device 20 according to Embodiment 1 and is a sectional view along the A-A imaginary plane in FIG. 1. A structure of the inverter unit 22b will be described with reference to FIG. 3. The structure in FIG. 3 is applied similarly to the other inverter units 22c, 22d, 22e.

The inverter unit 22b includes the casing 21 for incorporating inverter unit components. The casing 21 includes a ceiling portion 21a including ceiling-side vent holes 241, a floor portion 21c including floor-side vent holes 242, and a housing portion 21b provided between the ceiling portion 21a and the floor portion 21c. The housing portion 21b communicates with the ceiling portion 21a and the floor portion 21c.

A ceiling board 212 is interposed between the ceiling portion 21a and the housing portion 21b. A floor board 210 is interposed between the housing portion 21b and the floor portion 21c. A front door 201 configured to be operable/closable is provided at the front of the housing portion 21b. A rear door 202 configured to be openable/closable is provided at the rear of the housing portion 21b. The housing portion 21b includes a first housing chamber 220 and a second housing chamber 222 separated by a partition wall 203.

The inverter circuit board 230 is housed in the housing portion 21b, more specifically, housed in the first housing chamber 220 included in the housing portion 21b. On the first housing chamber 220 side, one surface of the partition wall 203 is exposed. The inverter circuit board 230 is attached to the one surface of the partition wall 203. The inverter circuit board 230 includes a board body 204 that is in direct contact with the one surface of the partition wall 203, and a circuit element 205 mounted on the board body 204. The circuit element 205 includes the aforementioned semiconductor switching device and freewheeling diode.

On the second housing chamber 222 side, another surface of the partition wall 203 is exposed. It is preferable that the partition wall 203 be formed of a material having high thermal conductivity such as metal. A water-cooling heat dissipation member 207 is attached to the other surface of the partition wall 203. The water-cooling heat dissipation member 207 is disposed at a site on the opposite side of the partition wall 203 from the inverter circuit board 230.

The water-cooling heat dissipation member 207 is a heat pipe that allows a coolant to flow inside. Instead of the water-cooling heat dissipation member 207, an air-cooling heat dissipation member such as a heat dissipation fin may be used. A first heat generation component 206 and a second heat generation component 208 each connected to the inverter circuit board 230 are attached to the other surface of the partition wall 203. The first heat generation component 206 is a reactor and the second heat generation component 208 is a capacitor.

Inner vent holes 212a via which a ceiling space 224 of the ceiling portion 21a and the housing portion 21b communicate with each other are provided in the ceiling board 212. The cooling fan 209 is installed in the floor board 210, which makes an underfloor space 226 of the floor portion 21c and the second housing chamber 222 of the housing portion 21b communicate with each other.

The cooling fan 209 generates flowing air in such a manner that the flowing air hits the water-cooling heat dissipation member 207 by flowing in the second housing chamber 222. The cooling fan control circuit 32 is configured to control the cooling fan 209 so that the flowing air flows from the ceiling-side vent holes 241 toward the floor-side vent holes 242. The cooling fan 209 generates flowing air flowing through the housing portion 21b so as to cool the inverter circuit board 230. The cooling fan control circuit 32 is configured to, if a temperature sensed by the temperature sensor 34 is higher than a predetermined temperature set in advance, turn on the cooling fan 209. This is also referred to as "normal on state" of the cooling fan 209.

The cooling fan control circuit 32 is configured to, if the sensed temperature is equal to or below the predetermined temperature, turn off the cooling fan 209. While "forced air cooling" is performed by turning on the cooling fan 209, "self-cooling" is performed upon turning off the cooling fan 209.

Figure 4:
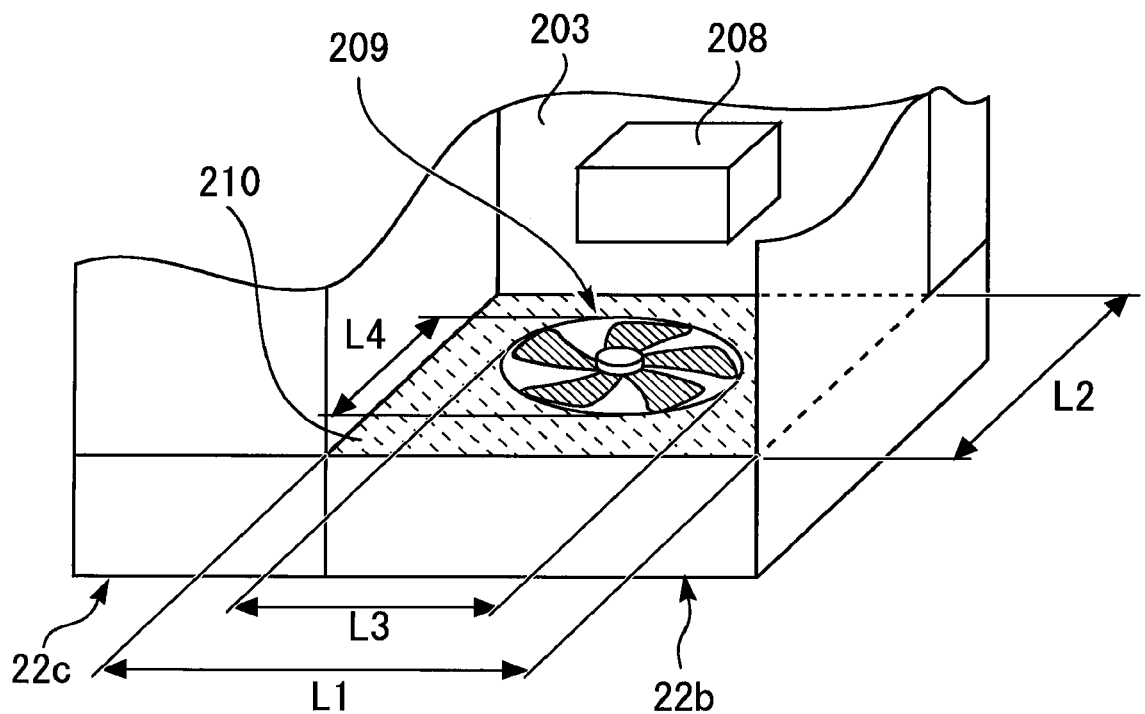
FIG. 4 is a perspective diagram illustrating the inner structure of the power conversion device according to Embodiment 1.

FIG. 4 is a perspective diagram of the inner structure of the power conversion device 20 according to Embodiment 1. In Embodiment 1, the cooling fan 209 is installed in the floor board 210. It is preferable that the cooling fan 209 be relatively large in size, and furthermore, it is preferable that there are sufficiently large spaces between respective vanes. This is intended to generate an air flow from the lower side to the upper side of the housing portion 21b by means of air convection during "self-cooling" in which the cooling fan 209 is off.

Figure 5:
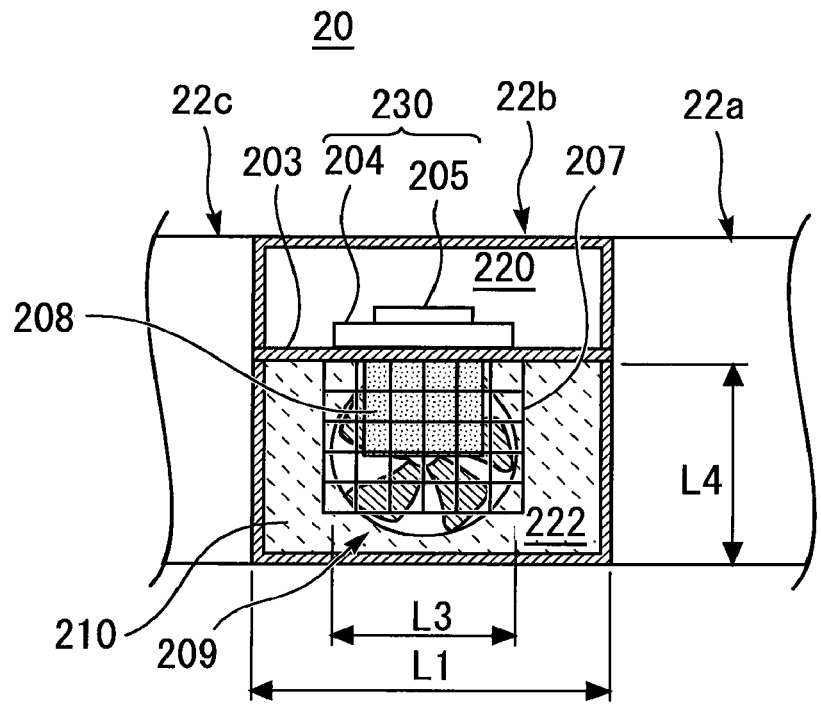
FIG. 5 is a plan view illustrating the inner structure of the power conversion device according to Embodiment 1.

FIG. 5 is a plan view illustrating the inner structure of the power conversion device 20 according to Embodiment 1. As illustrated in FIG. 5, the cooling fan 209 is provided in a center portion of the floor board 210 so as to be sufficiently large in size and overlap with the water-cooling heat dissipation member 207 in a plan view of the floor board 210. The size of the cooling fan 209 can variously be altered as necessary. A diameter of the cooling fan 209 may be designed to be so large that the cooling fan 209 protrudes from an outer shape of the water-cooling heat dissipation member 207 in a plan view of the floor board 210. The diameter of the cooling fan 209 may be designed to be a diameter that allows the cooling fan 209 to fall within the inside of the outer shape of the water-cooling heat dissipation member 207 in a plan view of the floor board 210.

Figure 6:
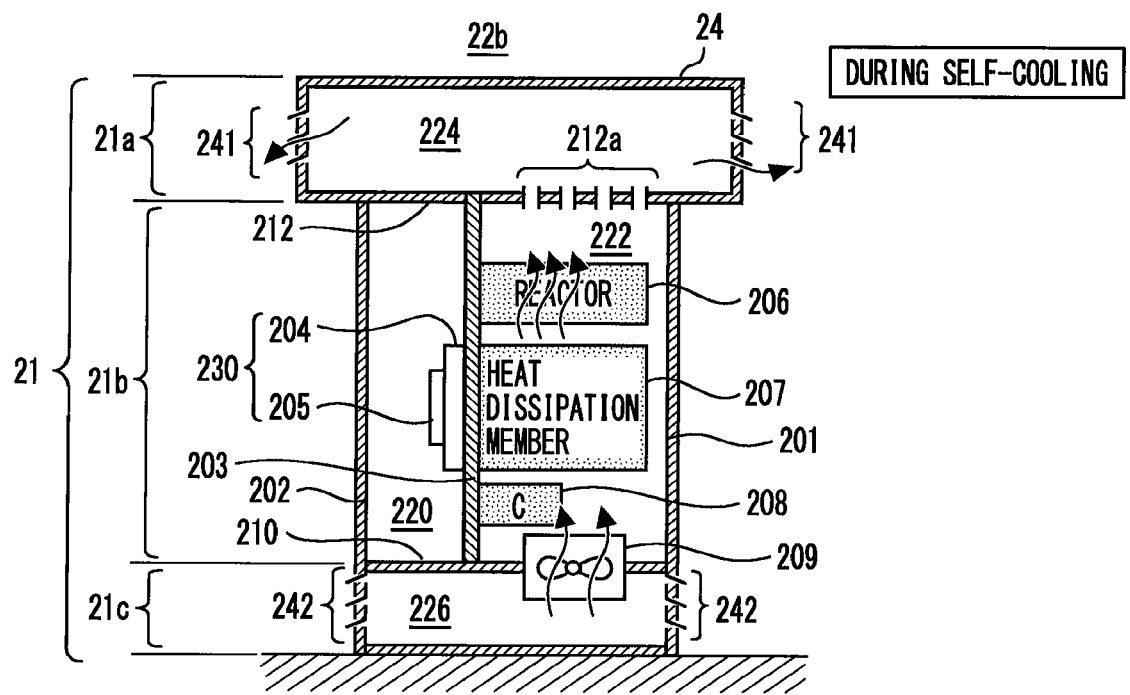
FIG. 6 is a diagram for describing operation of the power conversion device according to Embodiment 1.
Figure 7:
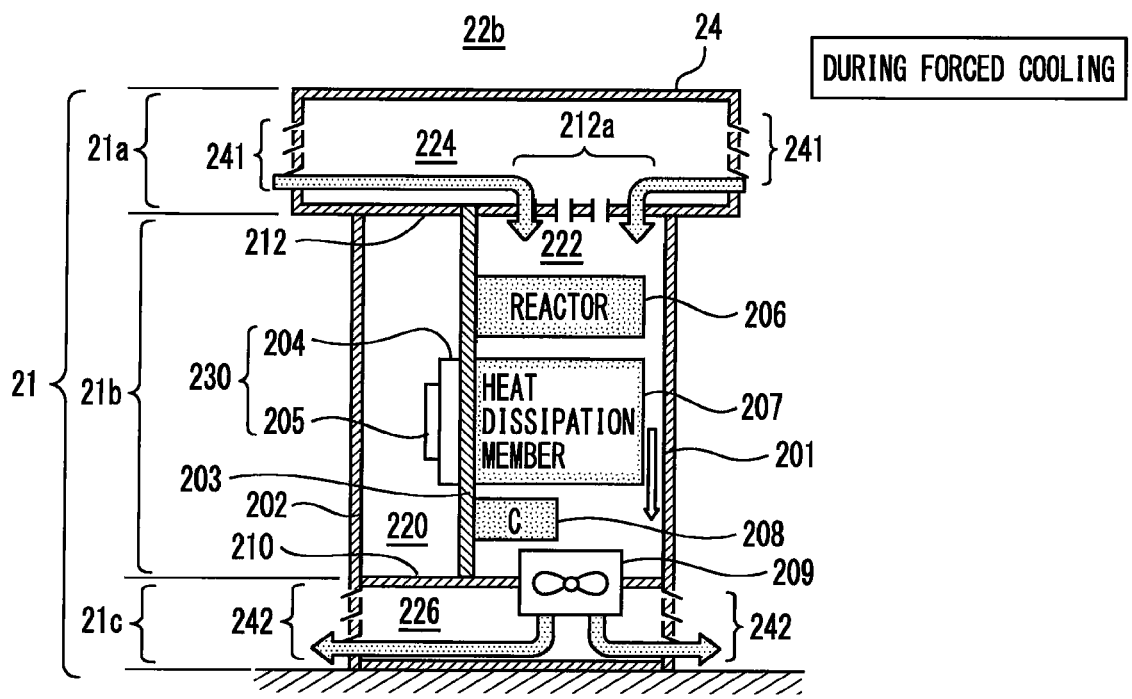
FIG. 7 is a diagram for describing operation of the power conversion device according to Embodiment 1.

FIGS. 6 and 7 are diagrams for describing operation of the power conversion device 20 according to Embodiment 1. FIG. 6 illustrates a state during self-cooling and FIG. 7 illustrates a state during forced air cooling. Embodiment 1 enables determining a necessary cooling amount according to a sensed temperature and switching the operation of the cooling fan 209 so as to increase/decrease a speed of flowing air as necessary.

When the necessity for cooling is low, as illustrated in FIG. 6, entry of external air containing dust can be suppressed by turning off the cooling fan 209 even during operation of the power conversion device 20. Turning off the cooling fan 209 enables the inverter circuit board 230 to be self-cooled by air flowing in from the floor-side vent holes 242. Turning off the cooling fan 209 enables extension of the life of the cooling fan 209. Since external air contains not only dust but also moisture, entry of moisture to the casing 21 can also be suppressed.

On the other hand, when the necessity for cooling is high, as illustrated in FIG. 7, the inverter circuit board 230 can be cooled by flowing air by turning on the cooling fan 209. Also, according to Embodiment 1, as illustrated in FIG. 7, the cooling fan 209 is controlled so that flowing air flows from the ceiling-side vent holes 241 toward the floor-side vent holes 242. Dust falls in a vertical direction because of gravity and accumulates on the lower side. Therefore, dust easily accumulates on the floor portion 21c side. Embodiment 1 enables entry of dust from the floor portion 21c side to the second housing chamber 222 to be suppressed by taking in air from the ceiling portion 21a and making the air flow to the floor portion 21c.

Modifications of Embodiment 1 will be described. As a modification of Embodiment 1, the cooling fan control circuit 32 may be configured to, when a sensed temperature is equal to or below a predetermined temperature, perform low-speed control of the cooling fan 209. The low-speed control refers to control to drive the cooling fan 209 so as to make a speed of flowing air lower than a speed when the cooling fan 209 is in the normal on state. More specifically, where a first rotation speed is a rotation speed of the cooling fan 209 when the cooling fan 209 is in the normal on state and a second rotation speed is a rotation speed of the cooling fan 209 at the time of the low-speed control of the cooling fan 209, the second rotation speed is set to be lower than the first rotation speed.

In Embodiment 1, flowing air indirectly cools the inverter circuit board 230 via the water-cooling heat dissipation member 207 that performs heat exchange with the inverter circuit board 230. On the other hand, as a modification, the inverter circuit board 230 may directly be cooled by making flowing air directly hit the inverter circuit board 230.

Although in Embodiment 1, the subject is the inverter unit 22b with the inverter circuit board 230 incorporated therein, as a modification, a cooling fan 209 that is similar to that of Embodiment 1 may be added to the control unit 22a. The control unit 22a and the inverter units 22b, 22c, 22d, 22e are in common in terms of including a casing 21 but are different from each other in terms of which of an inverter control circuit board 30 and an inverter circuit board 230 is included inside the casing 21. The cooling fan 209 may be added to the control unit 22a.

The cooling fan control circuit 32 changes the content of control of the cooling fan 209 based on comparison between a temperature sensed by the temperature sensor 34 and the predetermined temperature set in advance. Here, variations of the predetermined temperature will be described. The predetermined temperature may be set to be a predetermined temperature that is higher than 0° C. The predetermined temperature may be set to be 27° C., which is room temperature, that is, 300 K. The predetermined temperature may be set to be a temperature that is higher than 27° C. The predetermined temperature may be set to be a temperature that is higher than 0° C. but lower than 27° C. The predetermined temperature may be set to be exactly 0° C.

The predetermined temperature may be set to be below freezing or may be set to be, e.g., minus 20° C. There are cases where an antifreeze for the water-cooling heat dissipation member 207 is used, and the antifreeze is also called a long-life coolant. The predetermined temperature may be set to be the same as a freezing temperature of the antifreeze that is being used, and may be set to be a temperature that is higher than the freezing temperature but lower than 0° C.

The coolant flows inside the water-cooling heat dissipation member 207. When the power conversion device 20 is brought into operation under a low-temperature atmosphere, cold air actively hits the water-cooling heat dissipation member 207 because of driving of the cooling fan 209, which may cause freezing of the coolant. There are various locations having an environment that generates a low-temperature atmosphere, and more specifically, such locations include cold regions, high-altitude areas and terrains that have a low altitude but easily cause freezing in winter. The circuit element 205 provided in the inverter circuit board 230 generates heat upon being energized. The cold air hitting the water-cooling heat dissipation member 207 is reduced by stopping the cooling fan 209 or decreasing the air speed of the cooling fan 209. Reduction of cold air hitting the water-cooling heat dissipation member 207 enables freezing of the coolant to be prevented by transmission of heat generated by the circuit element 205 to the water-cooling heat dissipation member 207. Therefore, freezing of the water-cooling heat dissipation member 207 can be prevented by driving control of the cooling fan 209.

As a modification, the cooling fan control circuit 32 may store a plurality of predetermined temperatures. The plurality of predetermined temperatures may include a first predetermined temperature and a second predetermined temperature that is set to be lower than the first predetermined temperature. The cooling fan control circuit 32 may be configured to, if a sensed temperature falls within a temperature range that is equal to or below the first predetermined temperature but higher than the second predetermined temperature, control the cooling fan 209 so that a speed of flowing air becomes lower than a speed when the cooling fan 209 is in the on state. The cooling fan control circuit 32 may be configured to, if a sensed temperature is equal to or below the second predetermined temperature, turn off the cooling fan 209.

Figure 8:
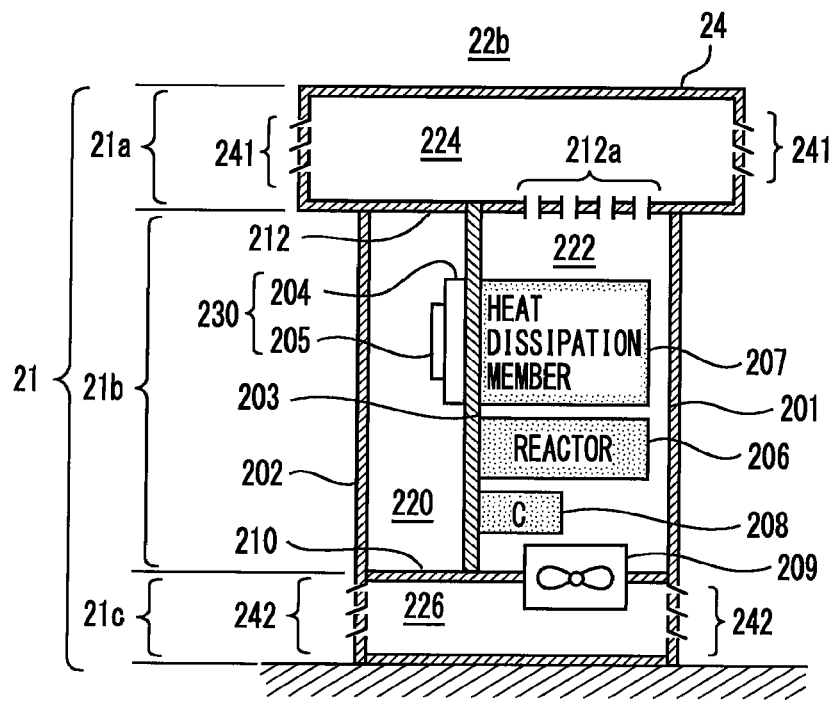
FIG. 8 is a sectional view illustrating an inner structure of a power conversion device according to a modification of Embodiment 1.

FIGS. 8 to 13 are sectional views each illustrating an inner structure of a power conversion device 20 according to a modification of Embodiment 1. A mutual positional relationship among a first heat generation component 206, a second heat generation component 208 and a water-cooling heat dissipation member 207 have various variations. As illustrated in FIG. 8, both a first heat generation component 206, which is a reactor, and a second heat generation component 208, which is a capacitor, may be provided below a water-cooling heat dissipation member 207. One of the first heat generation component 206 and the second heat generation component 208 may be provided above the water-cooling heat dissipation member 207 and the other of the first heat generation component 206 and the second heat generation component 208 may be provided below the water-cooling heat dissipation member 207. As a countermeasure for freezing of the water-cooling heat dissipation member 207, a phenomenon that hot air heated by heat generated by the first heat generation component 206 and the second heat generation component 208 moves upward may be utilized and the water-cooling heat dissipation member 207 may be heated by the hot air. As a result, freezing of the water-cooling heat dissipation member 207 is suppressed.

Figure 9:
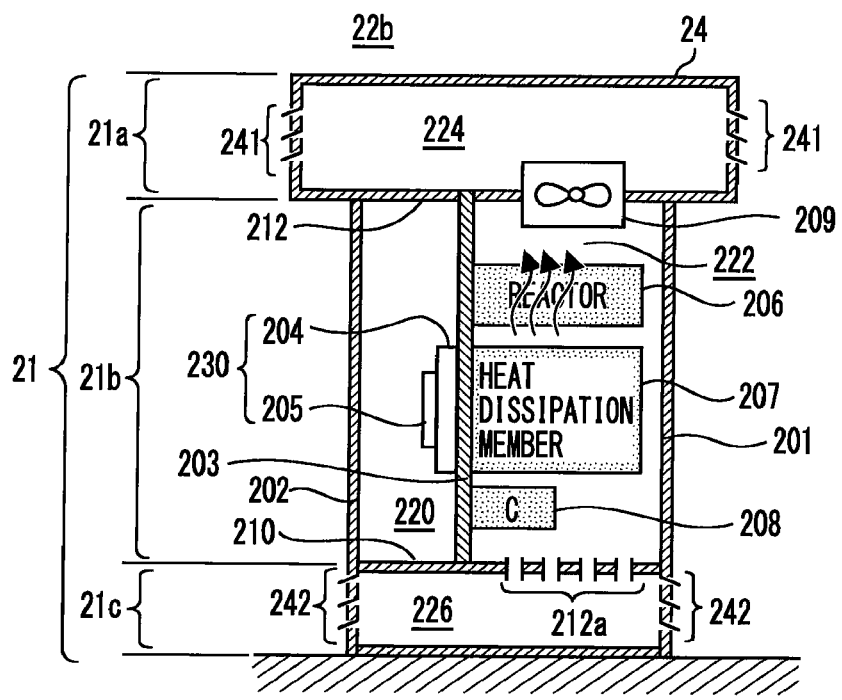
FIG. 9 is a sectional view illustrating an inner structure of a power conversion device according to a modification of Embodiment 1.
Figure 10:
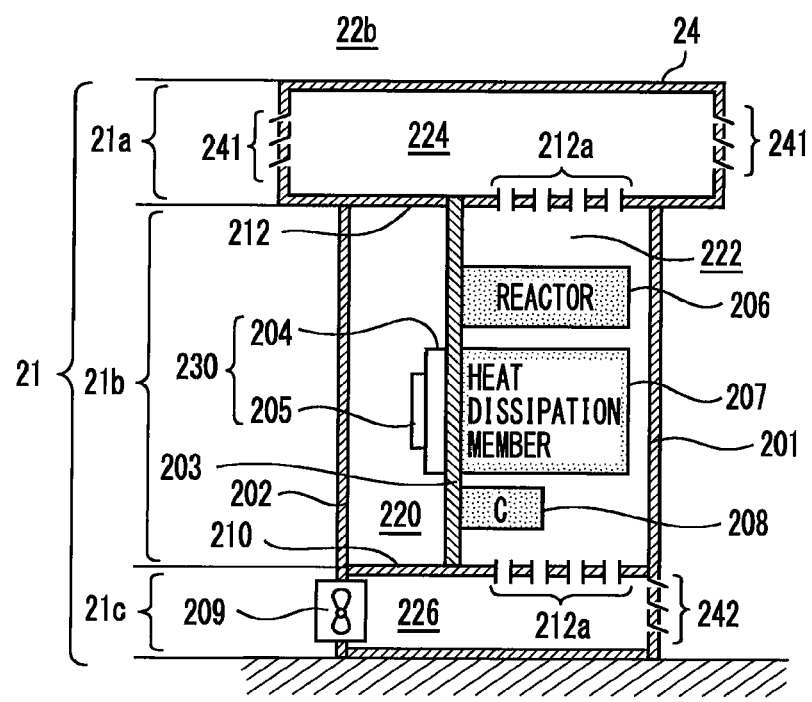
FIG. 10 is a sectional view illustrating an inner structure of a power conversion device according to a modification of Embodiment 1.
Figure 11:
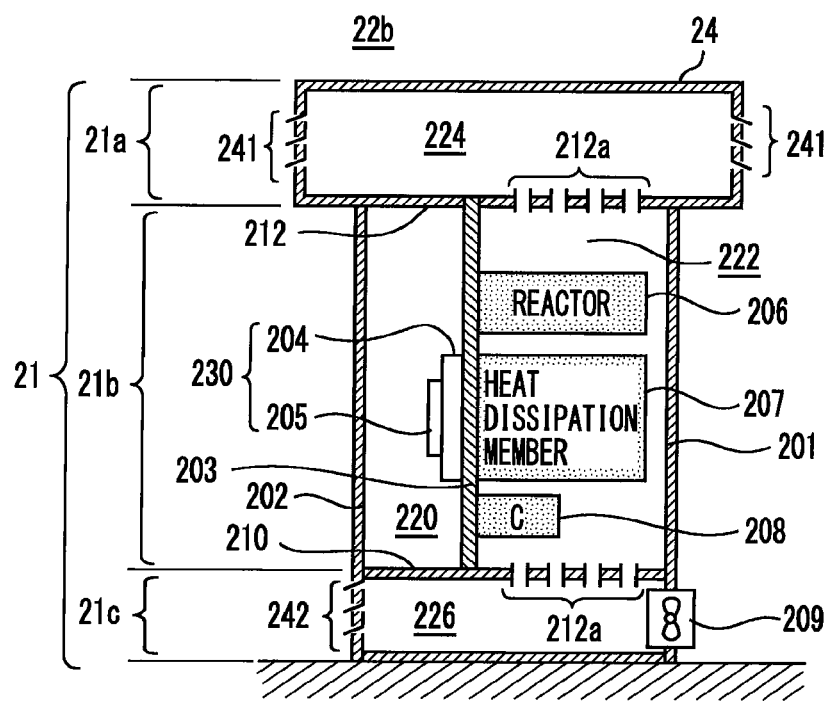
FIG. 11 is a sectional view illustrating an inner structure of a power conversion device according to a modification of Embodiment 1.
Figure 12:
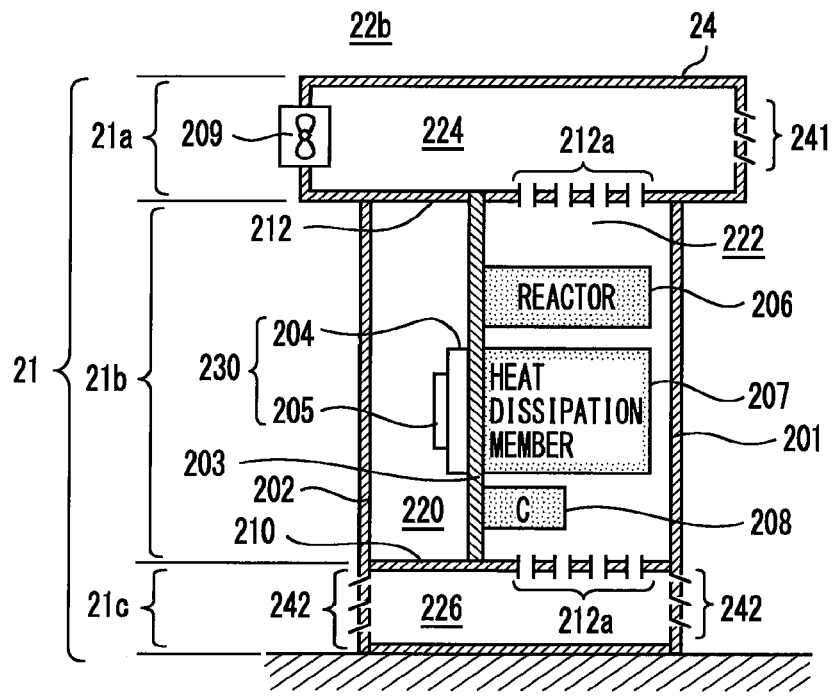
FIG. 12 is a sectional view illustrating an inner structure of a power conversion device according to a modification of Embodiment 1.
Figure 13:
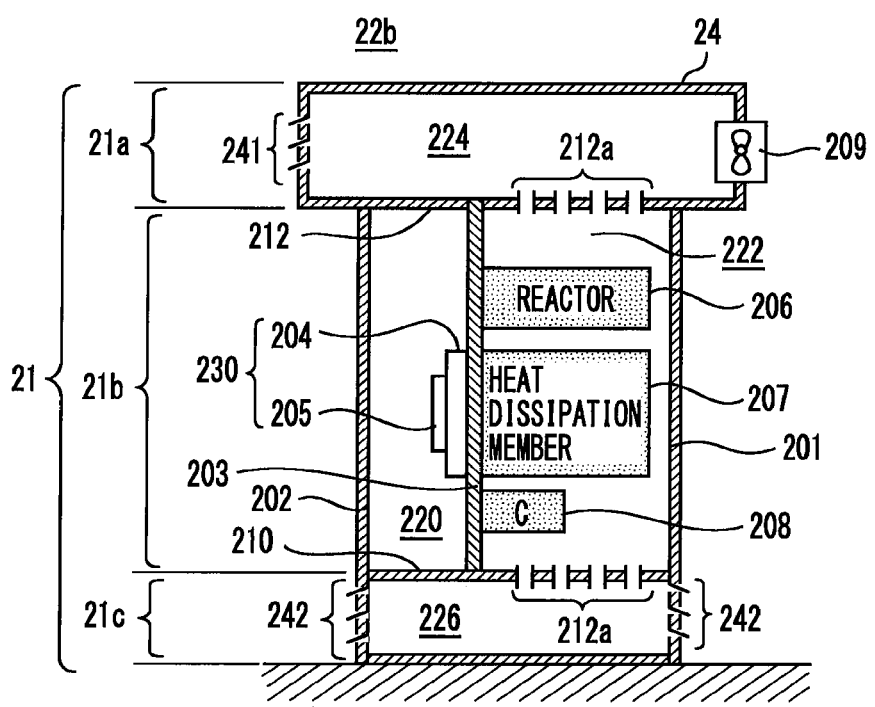
FIG. 13 is a sectional view illustrating an inner structure of a power conversion device according to a modification of Embodiment 1.

A position to which the cooling fan 209 is attached may be altered variously. As illustrated in FIG. 9, a cooling fan 209 may be attached to a ceiling board 212. As illustrated in FIG. 10, a cooling fan 209 may be attached to the rear side of a floor portion 21c. As illustrated in FIG. 11, a cooling fan 209 may be attached to the front side of a floor portion 21c. As illustrated in FIG. 12, a cooling fan 209 may be attached to the rear side of a ceiling portion 21a. As illustrated in FIG. 13, a cooling fan 209 may be attached to the front side of a ceiling portion 21a.

Embodiment 2

Figure 14:
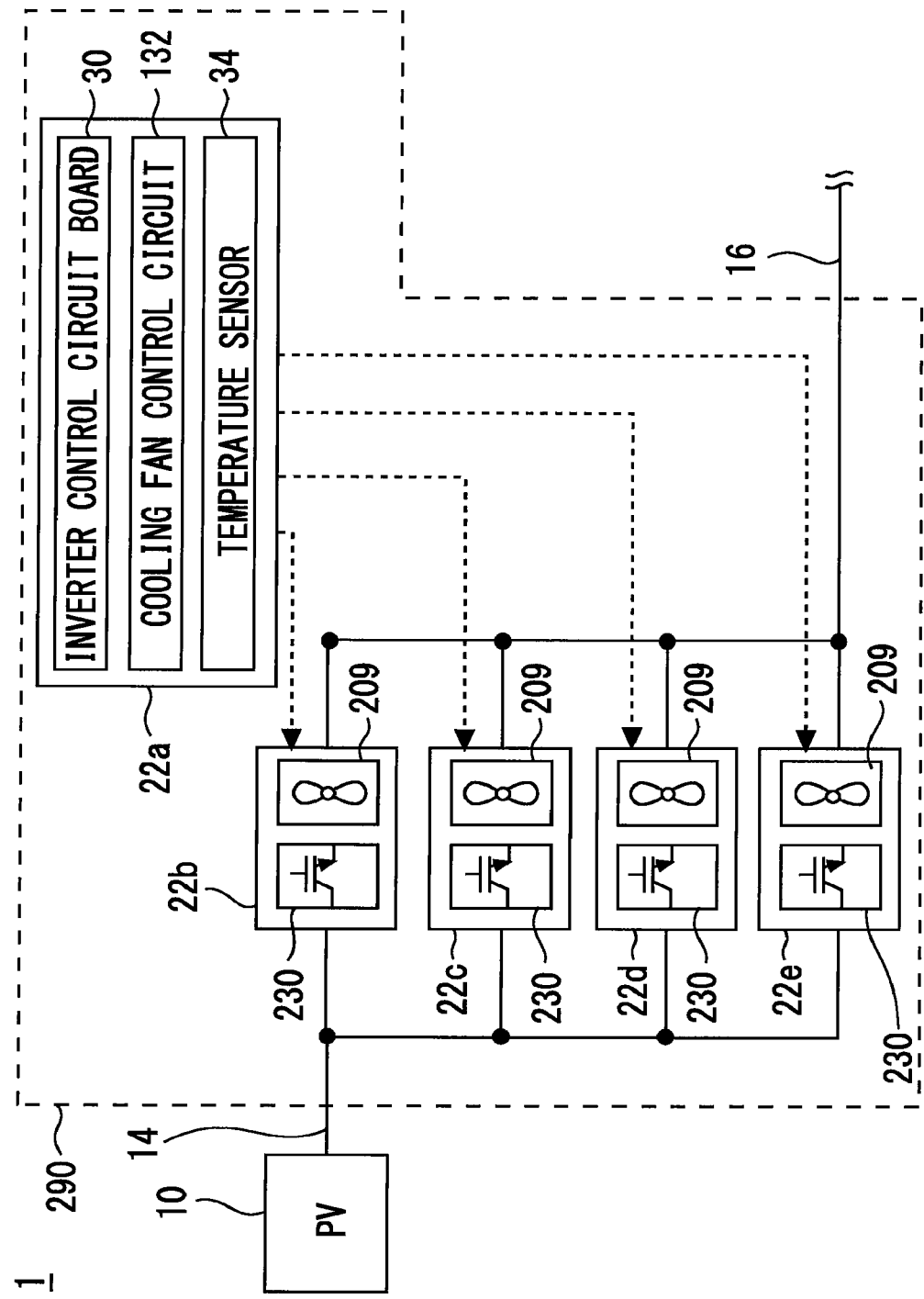
FIG. 14 is a circuit diagram of a power conversion device according to Embodiment 2.

FIG. 14 is a circuit diagram of a power conversion device 290 according to Embodiment 2. The power conversion device 290 according to Embodiment 2 has a structure that is similar to that of the power conversion device 20 according to Embodiment 1 except that the cooling fan control circuit 32 is replaced with a cooling fan control circuit 132. Unlike Embodiment 1, the cooling fan control circuit 132 is configured to, during operation of the power conversion device 290, consistently rotate a cooling fan 209 at a constant speed. The cooling fan control circuit 132 controls the cooling fan 209 so that flowing air flows from ceiling-side vent holes 241 toward floor-side vent holes 242.

In Embodiment 2, also, flowing air can be made to continuously flow in a direction that is the same as the direction of an arrow illustrated in FIG. 7 in Embodiment 1. Dust falls in a vertical direction because of gravity and accumulates on the lower side. Dust easily accumulates on the floor portion 21c side. Entry of dust from the floor portion 21c side can be suppressed by taking in air from a ceiling portion 21a and making the air flow to the floor portion 21c. The modifications described with reference to FIGS. 8 and 9 can be applied also to Embodiment 2.

Embodiment 3

Figure 15:
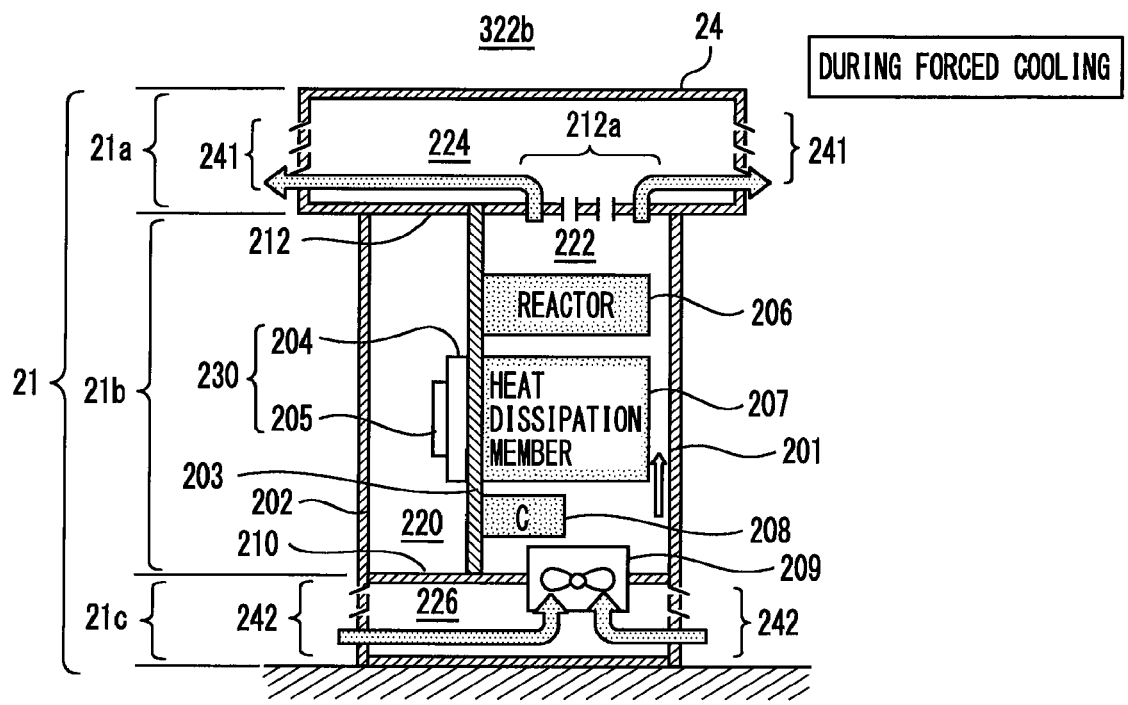
FIG. 15 is a sectional view illustrating an inner structure of a power conversion device according to Embodiment 3.

FIG. 15 is a sectional view illustrating an inner structure of an inverter unit 322b included in a power conversion device according to Embodiment 3. In comparison between the operation of the inverter unit 22b illustrated in FIG. 5 and operation of the inverter unit 322b illustrated in FIG. 15, the directions of respective arrows each indicating an air flow are opposite to each other. In Embodiment 3, a cooling fan control circuit 32 controls a cooling fan 209 so that flowing air flows from floor-side vent holes 242 toward ceiling-side vent holes 241. In other words, in Embodiment 3, a direction of rotation of the cooling fan 209 is set to be opposite to that of Embodiment 1. Embodiment 3 can be applied similarly to other inverter units 22c, 22d, 22e and can also be applied to a control unit 22a.

Except the difference in direction of rotation of the cooling fan 209, the inverter unit 322b according to Embodiment 3 has a structure that is in common with that of Embodiment 1 and performs control that is similar to that of Embodiment 1. According to Embodiment 3, as in Embodiment 1, flowing air can be made to flow in the direction of the arrow indicated in FIG. 15 and driving control of the cooling fan 209 can be switched based on whether or not a temperature sensed by a temperature sensor 34 is higher than a predetermined temperature. The modifications described with reference to FIGS. 8 and 9 can be applied also to Embodiment 3.

Figure 16:
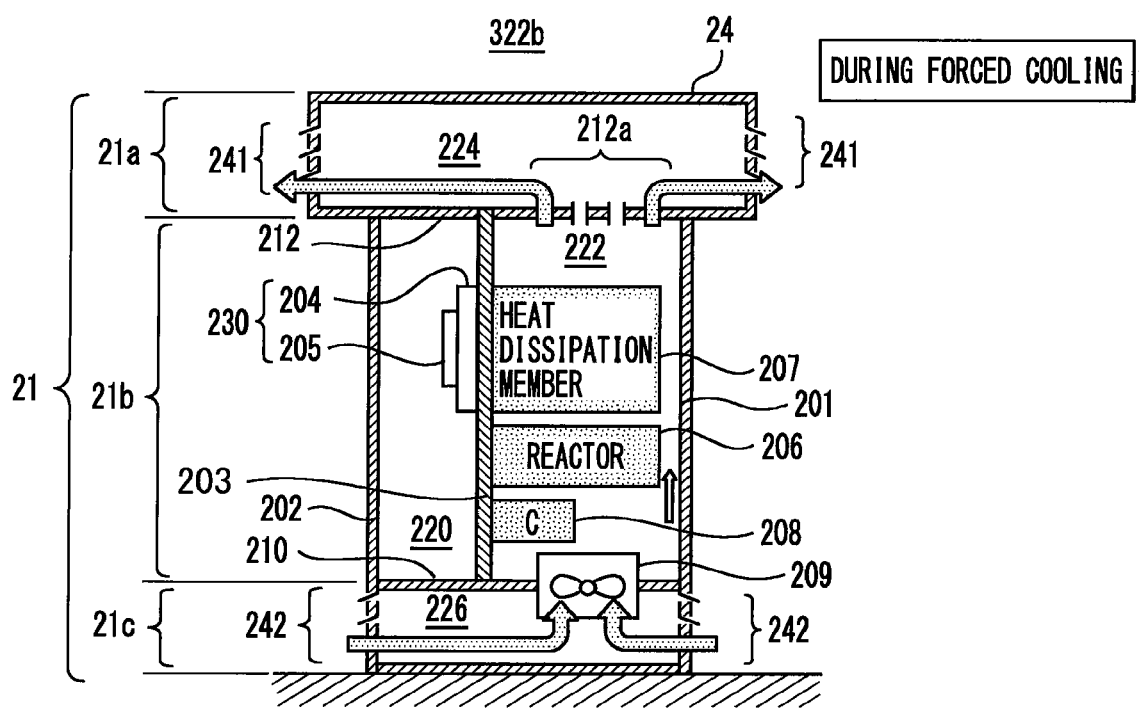
FIG. 16 is a sectional view illustrating an inner structure of a power conversion device according to a modification of Embodiment 3.

FIG. 16 is a sectional view illustrating an inner structure of an inverter unit 322b according to a modification of Embodiment 3. The modification in FIG. 16 relates to a positional relationship among a first heat generation component 206, a second heat generation component 208 and a water-cooling heat dissipation member 207, in which the water-cooling heat dissipation member 207 from among these three components is disposed on the uppermost side.

Hot air heated by heat generated by the first heat generation component 206 and the second heat generation component 208 moves upward. As a countermeasure for freezing of the water-cooling heat dissipation member 207, the water-cooling heat dissipation member 207 can be heated by the hot air. In addition, in Embodiment 3, a cooling fan 209 creates an air flow toward the upper side of a housing portion 21b, and thus, there is an advantage of being capable of facilitating hot air heated by heat generated by the first heat generation component 206 and the second heat generation component 208 coming into contact with the water-cooling heat dissipation member 207.

REFERENCE SIGNS LIST 1 power system
10 photovoltaic array
12 photovoltaic module
14 input wiring
16 output wiring
18 transformer
19 power grid 20, 290 power conversion device
21 casing
21a ceiling portion
21b housing portion
21c floor portion
22a control unit
22b, 22c, 22d, 22e, 322b inverter unit
30 inverter control circuit board
32, 132 cooling fan control circuit
34 temperature sensor
201 front door
202 rear door
203 partition wall
204 board body
205 circuit element
206 first heat generation component (reactor)
207 heat dissipation member (water-cooling heat dissipation member)
208 second heat generation component (capacitor)
209 cooling fan
210 floor board
212 ceiling board
212a inner vent hole
220 first housing chamber
222 second housing chamber
224 ceiling space
226 underfloor space
230 inverter circuit board
241 ceiling-side vent hole
242 floor-side vent hole

The invention claimed is:

1. A power conversion device comprising:
a casing including a housing portion, the housing portion being separated into a first housing chamber and a second housing chamber by a partition wall extending in a vertical direction, one surface of the partition wall being exposed to the first housing chamber side, another surface of the partition wall being exposed to the second housing chamber;
a circuit board housed in the first housing chamber, the circuit board including an inverter circuit or an inverter control circuit configured to control the inverter circuit, the circuit board being attached to the one surface of the partition wall;
a water-cooling heat dissipation member housed in the second housing chamber and attached to a site in the other surface of the partition wall, the site being on an opposite side of the partition wall from the circuit board, the water-cooling heat dissipation member allowing a coolant to flow inside;
a heat generation component housed in the second housing chamber and attached to the other surface of the partition wall, the heat generation component forming a circuit jointly with the inverter circuit;
a cooling fan configured to generate flowing air flowing in the second housing chamber;
a temperature sensor configured to sense a temperature inside the casing or outside the casing; and
a cooling fan control circuit configured to drive the cooling fan, wherein:
the cooling fan control circuit is configured to, if the temperature sensed by the temperature sensor is higher than a predetermined temperature set in advance, turn on the cooling fan;
if the sensed temperature is equal to or below the predetermined temperature, the cooling fan control circuit controls the cooling fan so as to turn off the cooling fan or make a speed of the flowing air lower than a speed when the cooling fan is in the on state; and
the heat generation component is disposed immediately below the water-cooling heat dissipation member in the vertical direction on the other surface of the partition wall.

2. The power conversion device according to claim 1, wherein:
the casing includes a ceiling portion including a ceiling-side vent hole and a floor portion including a floor-side vent hole;
the housing portion is provided between the ceiling portion and the floor portion and communicates with the ceiling portion and the floor portion;
if the sensed temperature is higher than the predetermined temperature, the cooling fan control circuit drives the cooling fan so that the flowing air flows from the ceiling-side vent hole toward the floor-side vent hole; and
the cooling fan control circuit is configured to, if the sensed temperature is equal to or below the predetermined temperature, turn off the cooling fan.

3. The power conversion device according to claim 2, wherein:
the heat generation component includes a reactor and a capacitor; and
the reactor and the capacitor are arranged in a line along the vertical direction, immediately below the water-cooling heat dissipation member in the vertical direction.

4. The power conversion device according to claim 3, wherein:
the water-cooling heat dissipation member includes an antifreeze; and
the predetermined temperature is a temperature set to be higher than a freezing temperature of the antifreeze but lower than 0° C.

5. The power conversion device according to claim 2, wherein:
the water-cooling heat dissipation member includes an antifreeze; and
the predetermined temperature is a temperature set to be higher than a freezing temperature of the antifreeze but lower than 0° C.

6. The power conversion device according to claim 1, wherein:
the heat generation component includes a reactor and a capacitor; and
the reactor and the capacitor are arranged in a line along the vertical direction, immediately below the water-cooling heat dissipation member in the vertical direction.

7. The power conversion device according to claim 6, wherein:
the water-cooling heat dissipation member includes an antifreeze; and
the predetermined temperature is a temperature set to be higher than a freezing temperature of the antifreeze but lower than 0° C.

8. The power conversion device according to claim 1, wherein:
the water-cooling heat dissipation member includes an antifreeze; and
the predetermined temperature is a temperature set to be higher than a freezing temperature of the antifreeze but lower than 0° C.

* * * * *